(12) United States Patent
Song et al.

(10) Patent No.: US 8,379,759 B2
(45) Date of Patent: Feb. 19, 2013

(54) DIGITAL BROADCASTING SYSTEM AND METHOD OF PROCESSING DATA

(75) Inventors: Won Gyu Song, Seoul (KR); In Hwan Choi, Gwacheon-si (KR); Kook Yeon Kwak, Anyang-si (KR); Byoung Gill Kim, Seoul (KR); Jin Woo Kim, Seoul (KR); Hyoung Gon Lee, Seoul (KR); Jong Moon Kim, Gwangmyeong-si (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/403,896

(22) Filed: Feb. 23, 2012

(65) Prior Publication Data

US 2012/0163477 A1 Jun. 28, 2012

Related U.S. Application Data

(63) Continuation of application No. 12/034,105, filed on Feb. 20, 2008, now Pat. No. 8,149,948.

(60) Provisional application No. 60/912,341, filed on Apr. 17, 2007.

(30) Foreign Application Priority Data

Feb. 20, 2007 (KR) .................. 10-2007-0017060

(51) Int. Cl.
*H04L 27/00* (2006.01)
(52) U.S. Cl. .............. 375/295; 375/240.01; 375/240.27; 375/262; 375/265; 375/340; 375/341
(58) Field of Classification Search ............. 375/240.01, 375/240.27, 265, 341, 343, 346; 714/778, 714/786
See application file for complete search history.

(56) References Cited

U.S. PATENT DOCUMENTS

| 5,691,993 | A | 11/1997 | Fredrickson | |
|---|---|---|---|---|
| 6,973,137 | B2 | 12/2005 | Birru et al. | |
| 2006/0104391 | A1* | 5/2006 | Choi et al. | 375/341 |
| 2006/0126757 | A1* | 6/2006 | Choi et al. | 375/301 |
| 2007/0079181 | A1* | 4/2007 | Yu | 714/701 |
| 2007/0168842 | A1* | 7/2007 | Jeong et al. | 714/786 |
| 2007/0180350 | A1* | 8/2007 | Choi et al. | 714/778 |
| 2008/0273589 | A1* | 11/2008 | Kim et al. | 375/240.01 |
| 2010/0302458 | A1* | 12/2010 | Kim et al. | 348/726 |

FOREIGN PATENT DOCUMENTS

WO 02/085014 10/2002

* cited by examiner

*Primary Examiner* — David Ometz
*Assistant Examiner* — Eboni Hughes
(74) *Attorney, Agent, or Firm* — Lee, Hong, Degerman, Kang & Waimey

(57) ABSTRACT

A digital broadcasting system and method of processing data are disclosed. Herein, a transmitting system within the digital broadcasting system includes a byte-symbol converter, an interleaving unit, a block formatter, and a trellis encoding module. Herein, the byte-symbol converter converts inputted mobile service data to symbol units. The interleaving unit is provided with (N−1) number of block interleavers in parallel, and interleaves the symbols outputted from the byte-symbol converter. The block formatter controls output orders of the mobile service data being inputted and data being outputted from each block interleaver within the interleaving unit. The trellis encoding module is provided with a plurality of trellis encoders in parallel, and enables each trellis encoder trellis-encode the mobile service data.

8 Claims, 13 Drawing Sheets

DIGITAL BROADCASTING SYSTEM AND METHOD OF PROCESSING DATA

This application is a continuation of application Ser. No. 12/034,105, filed on Feb. 20, 2008 now U.S. Pat. No. 8,149,948, which claims the benefit of earlier filing date and right to priority to Korean Application No. 10-2007-0017060, filed on Feb. 20, 2007, and U.S. Provisional Application No. 60/912,341, filed on Apr. 17, 2007, the contents of all of which are incorporated by reference herein in their entireties.

BACKGROUND OF THE INVENTION

1. Field of the Invention

The present invention relates to a digital broadcasting system and a method of processing data.

2. Discussion of the Related Art

The Vestigial Sideband (VSB) transmission mode, which is adopted as the standard for digital broadcasting in North America and the Republic of Korea, is a system developed for the transmission of MPEG audio/video data. However, since the VSB transmission mode is a single carrier method, the receiving performance of the receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a digital broadcasting system and a data processing method that substantially obviate one or more problems due to limitations and disadvantages of the related art.

An object of the present invention is to provide a digital broadcasting system and a method of processing data that are highly resistant to channel changes and noise.

Another object of the present invention is to provide a digital broadcasting system and a method of processing data that can enhance the receiving performance of a receiving system by performing additional encoding on mobile service data and by transmitting the processed data to the receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a transmitting system includes a byte-symbol converter, an interleaving unit, a block formatter, and a trellis encoding module. Herein, the byte-symbol converter converts inputted mobile service data to symbol units and outputs the mobile service data symbols. The interleaving unit is provided with (N−1) number of block interleavers in parallel, and interleaves the symbols outputted from the byte-symbol converter in predetermined block units. The block formatter controls output orders of the mobile service data being inputted and data being outputted from each block interleaver within the interleaving unit, based upon data information inputted from an external source. The trellis encoding module is provided with a plurality of trellis encoders in parallel, and enables each trellis encoder trellis-encode the mobile service data outputted from the block formatter, thereby outputting the trellis-encoded mobile service data.

In another aspect of the present invention, a data processing method of a transmitting system includes the steps of (a) converting inputted mobile service data to symbol units and outputting the mobile service data symbols, (b) having (N−1) number of block interleavers configured in parallel each perform block interleaving in predetermined block units on the mobile service data symbols, (c) controlling output orders of the mobile service data of step (a) and (N−1) number block-interleaved mobile service data symbols in step (b), based upon data information inputted from an external source, and (d) trellis encoders trellis-encode the corresponding mobile service data outputted from step (c), thereby outputting the trellis-encoded mobile service data.

In a further aspect of the present invention, a receiving system includes a block decoder, and a demultiplexer. The block decoder is provided with N number of decoders in parallel, each decoder including at least a buffer, an adder, and a trellis encoder. Herein, each decoder repeatedly turbo-decodes inputted mobile service data in accordance with a predetermined number of repetitions. The demultiplexer divides the received mobile service data and outputs the divided mobile service data to the N number of decoders included in the block decoder. Herein, the buffer may store mobile service data of the corresponding block outputted from the demultiplexer while the turbo decoding process is repeated for a predetermined number of times. The adder may add the turbo-decoded and fed-back data to the mobile service data stored in the buffer, wherein the positions of the mobile service data correspond to the same position within the block as the turbo-decoded and fed-back data, and may output the added data. Finally, the trellis decoder may trellis-decode the data outputted from the adder and output the trellis-decoded data as a soft decision value.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the mobile service data may either consist of data including information such as program execution files, stock information, weather forecast, and so on, or consist of video/audio data. Additionally, the known data refer to data already known based upon a predetermined agreement between a transmitter and a receiver. Furthermore, the main service data consist of data that can be received from the conventional receiving system, wherein the main service data include video/audio data. A data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

The present invention relates to a transmission system that can be compatible with the conventional transmission method. Additionally, the transmission system may also multiplex the main service data and mobile service data of the same channel, and then, transmit the multiplexed data. Furthermore, the transmitting system according to the present invention may perform additional encoding, and insert data pre-known by both transmitting and receiving systems (i.e., known data) and transmit the processed data. When using the transmitting system according to the present invention, the mobile service data may be received while the user is in a mobile state (i.e., traveling). Also, the mobile service data may be received with stability despite the noise and diverse distortion occurring in the channel. Particularly, by performing parallel turbo coding on the mobile service data, the receiving performance of the present invention may be enhanced.

Figure 1:
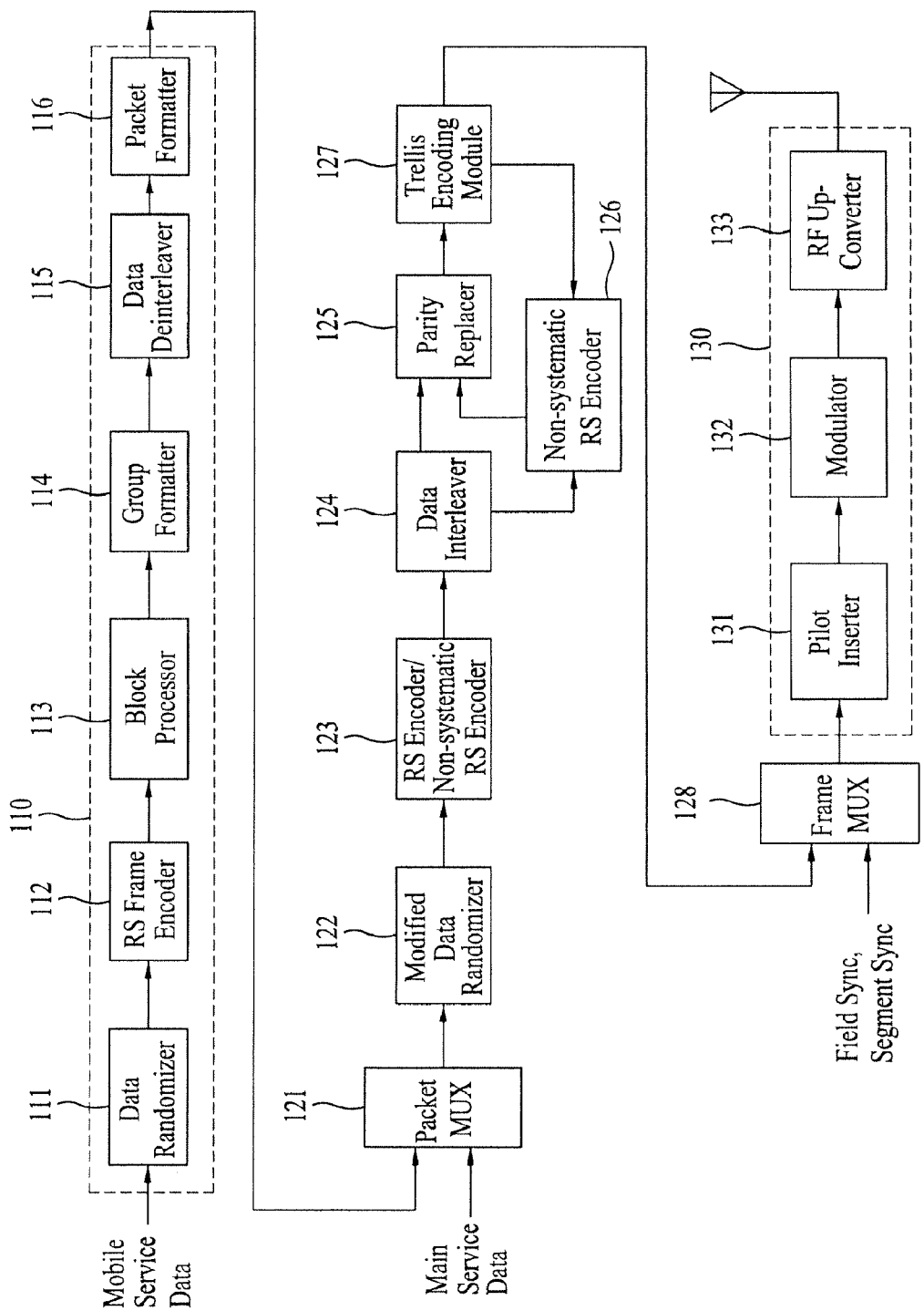
FIG. 1 illustrates a block diagram showing a structure of a transmitting system according to an embodiment of the present invention.

FIG. 1 illustrates a transmitting system according to an embodiment of the present invention. Referring to FIG. 1, the transmitting system includes a pre-processor 110, a packet multiplexer 121, a modified data randomizer 122, a RS encoder/non-systematic RS encoder 123, a data interleaver 124, a parity replacer 125, a non-systematic RS encoder 126, a trellis encoding module 127, a frame multiplexer 128, and a transmission unit 130. The pre-processor 110 includes a data randomizer 111, a RS frame encoder 112, a block processor 113, a group formatter 114, a data deinterleaver 115, and a packet formatter 116. In the above-described structure of the present invention, the main service data are inputted to the packet multiplexer 121, and the mobile service data are inputted to the pre-processor 110, which performs additional encoding so that the mobile service data can respond more effectively to noise and channel environment that undergoes frequent changes. The data randomizer 111 of the pre-processor 110 receives mobile service data and randomizes the received data, thereby outputting the processed mobile service data to the RS frame encoder 112. At this point, by having the data randomizer 111 randomize the mobile service data, a later randomizing process on the mobile service data performed by the modified data randomizer 122, which is positioned in a later block, may be omitted.

The RS frame encoder 112 performs at least one of an error correction encoding process and an error detection encoding process on the randomized mobile service data that are received. Accordingly, by providing robustness on the corresponding mobile service data, a group error that may occur due to a change in the frequency environment can be scattered, thereby enabling the corresponding data to respond to the severely vulnerable and frequently changing frequency environment. The RS frame encoder 112 may also perform a row permutation process, which permutes in row units mobile service data having a predetermined size. In the embodiment of the present invention, the RS frame encoder 112 performs the error correction encoding process on the received mobile service data so as to add data for error correction. Thereafter, the RS frame encoder 112 performs the error detection encoding process so as to add data for error detection.

Herein, RS encoding is applied as the error correction encoding process, and cyclic redundancy check (CRC) encoding is applied as the error detection encoding process. When performing RS encoding, parity data that are to be used for error correction are generated. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability (or performance) of the receiving system. The RS frame that is expanded by the error correction encoding and error detection encoding processes performed by the RS frame encoder 112 is then inputted to the block processor 113.

The block processor 113 additionally performs an encoding process at a coding rate of 1/N (wherein N is an integer) on the mobile service data, which are outputted from the RS frame encoder 112. (Herein, the mobile service data may include supplemental information such as signaling information wherein system information is also included.) Afterwards, the block processor 113 outputs the additionally encoded mobile service data to the group formatter 114. For example, if 1 bit of the input data is encoded so as to be outputted as 2 bits, then N is equal to 2 (i.e., N=2). Alternatively, if 1 bit of the input data is encoded so as to be outputted as 4 bits, then N is equal to 4 (i.e., N=4). In the description of the present invention, the former will be referred to as an encoding process at a ½ coding rate (also referred to as "½-rate coding"), and the latter will be referred to as an encoding process at a ¼ coding rate (also referred to as "¼-rate coding"), for simplicity. At this point, prior to performing the additional encoding process, the block processor 113 sends the corresponding mobile service data to a block-type interleaver. Accordingly, the mobile service data bypassing the interleaver and the mobile service data outputted from the interleaver are processed into blocks based upon a pre-defined method. Then, the processed data are outputted.

Figure 2A:
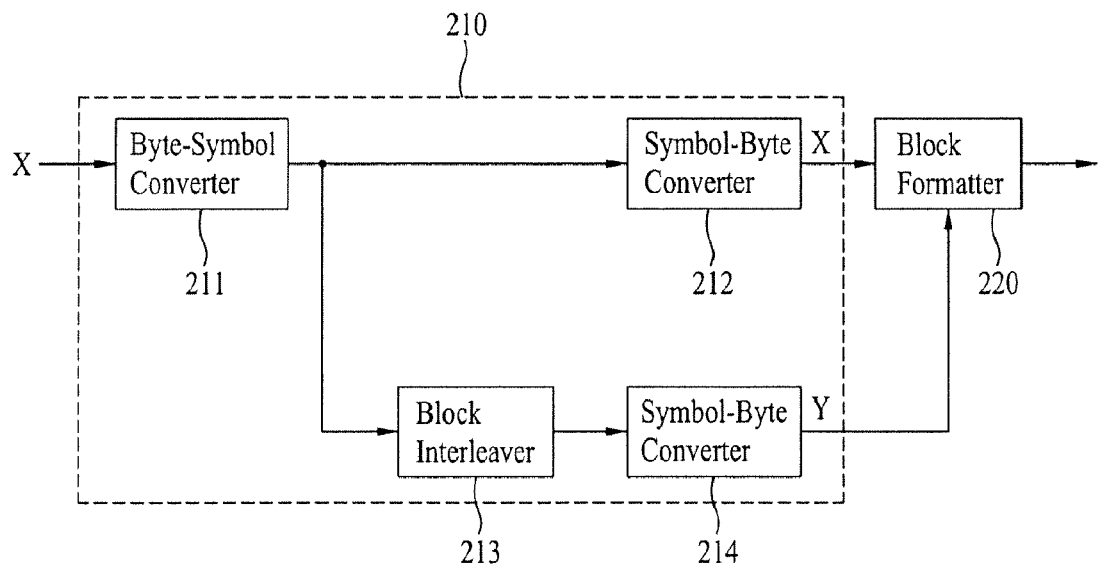
FIG. 2A and FIG. 2B illustrate block diagrams respectively showing exemplary structures of a block processor shown in FIG. 1.
Figure 3:
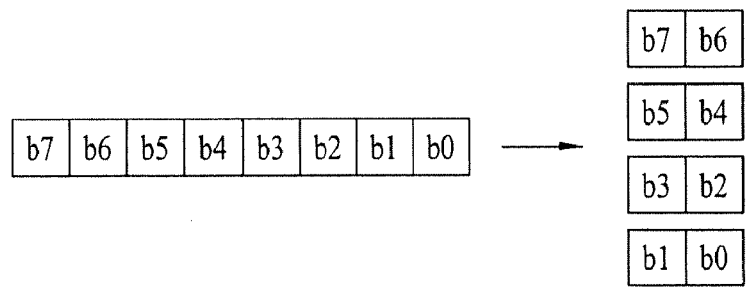
FIG. 3 illustrates an example of a byte-symbol converter shown in FIG. 2A and FIG. 2B.

FIG. 2A illustrates a block diagram showing the structure of a block processor performing ½-rate coding according to an embodiment of the present invention. Herein, the block processor includes an interleaving unit 210 and a block formatter 220. The interleaving unit 210 may include a byte-symbol converter 211, a symbol-byte converter 212, a block interleaver 213, and a symbol-byte converter 214. The byte-symbol converter 211 of the interleaving unit 210 converts the mobile service data X outputted in byte units from the RS frame encoder 112 to symbol units. Then, the byte-symbol converter 211 outputs the converted mobile service data symbols to the symbol-byte converter 212 and the block interleaver 213. More specifically, the byte-symbol converter 211 converts each 2 bits of the inputted mobile service data byte (=8 bits) to 1 symbol and outputs the converted symbols, as shown in FIG. 3. This is because the input data of the trellis encoding module 127 consist of symbol units configured of 2 bits. The relationship between the block processor 113 and the trellis encoding module 127 will be described in detail in a later process. FIG. 3 illustrates an example of the byte-symbol converter 211.

At this point, the byte-symbol converter 211 may also receive supplemental information, such as signaling information, which includes system information. Furthermore, such supplemental information may also be divided into symbol units and then outputted to the symbol-byte converter 212 and the block interleaver 213. Herein, the supplemental information such as the signaling information may be inputted to the block processor 113 by passing through the data randomizer 111 and the RS frame encoder 112, which is identical to the steps for processing the mobile service data. Otherwise, the supplemental information may also bypass the data randomizer 111 and the RS frame encoder 112, so as to be directly inputted to the block processor 113. The signaling information may correspond to information required by the receiving system for receiving and processing the data included in the data group. For example, the signaling information may include data group information, multiplexing information, burst information, and so on.

Figure 2B:
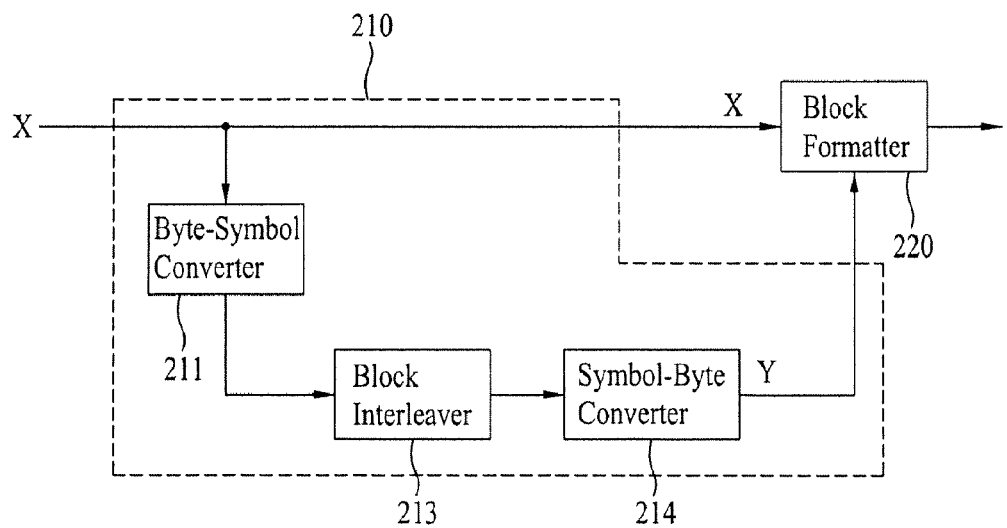

The symbol-byte converter 212 groups 4 symbols outputted from the byte-symbol converter 211 so as to configure a byte. Thereafter, the converted data bytes are outputted to the block formatter 220. Herein, each of the symbol-byte converter 212 and the byte-symbol converter 211 respectively performs an inverse process on one another. Therefore, the yield of these two blocks is offset. Accordingly, as shown in FIG. 2B, the input data X bypass the byte-symbol converter 211 and the symbol-byte converter 212 and are directly inputted to the block formatter 220. More specifically, the interleaving unit 210 of FIG. 2B has a structure equivalent to that of the interleaving unit shown in FIG. 2A. Therefore, the same reference numerals will be used in FIG. 2A and FIG. 2B.

The block interleaver 213 performs block interleaving in symbol units on the data that are outputted from the byte-symbol converter 211. Subsequently, the block interleaver 213 outputs the interleaved data to the symbol-byte converter 214. Herein, any type of interleaver that can rearrange the structural order may be used as the block interleaver 213 of the present invention. In the example given in the present invention, a variable length interleaver that may be applied for symbols having a wide range of lengths, the order of which is to be rearranged.

Figure 4:
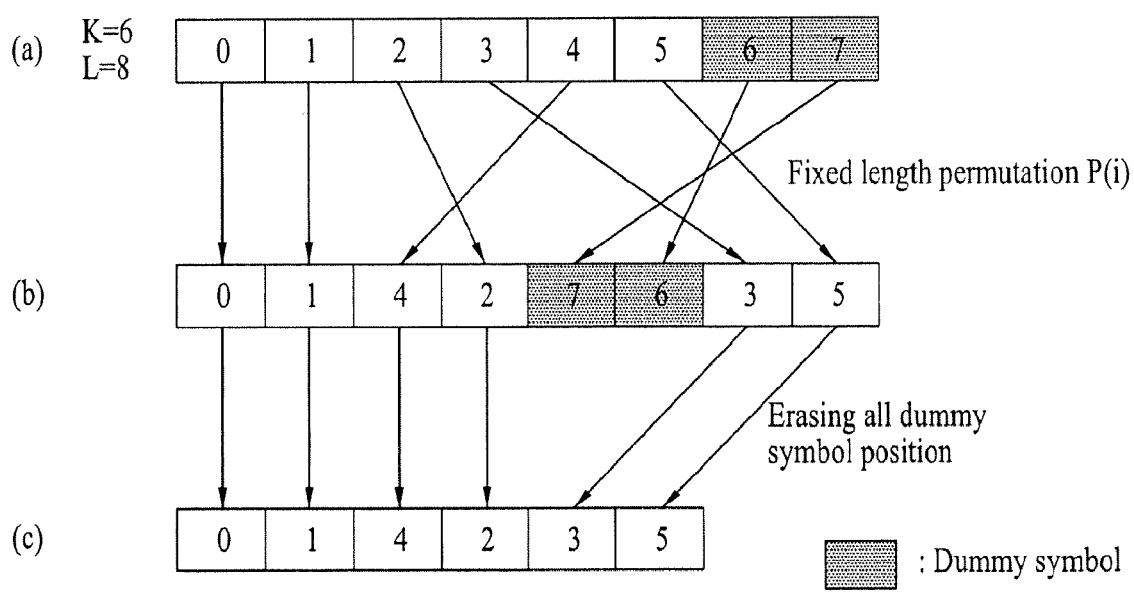
FIG. 4(a) to FIG. 4(c) illustrate an exemplary variable length interleaving process of the block interleaver shown in FIG. 2A and FIG. 2B.

FIG. 4 illustrates a block interleaver according to an embodiment of the present invention. Herein, the block interleaver according to the embodiment of the present invention corresponds to a variable length interleaver that may be applied even when a plurality of lengths is provided for the symbol, so that its order may be rearranged. Particularly, FIG. 4 illustrates an example of the block interleaver when K=6 and L=8. Herein, K indicates a number of symbols that are outputted for block interleaving from the byte-symbol converter 211. And, L represents a number of symbols that are actually interleaved by the block interleaver 213.

In the present invention, the block interleaver 213 should satisfy the conditions of $L=2^n$ (wherein n is an integer) and of $L \geq K$. If there is a difference in value between K and L, (L−K) number of null (or dummy) symbols is added, thereby creating an interleaving pattern. Therefore, K becomes a block size of the actual symbols that are inputted to the block interleaver 213 in order to be interleaved. L becomes an interleaving unit when the interleaving process is performed based upon an interleaving pattern created from the block interleaver 213.

FIG. 4 corresponds to an example of what is described above. The number of symbols outputted from the byte-symbol converter 211 in order to be interleaved is equal to 6 (i.e., K=6). In other words, 6 symbols are outputted from the byte-symbol converter 211 in order to be interleaved. And, the actual interleaving unit (L) is equal to 8 symbols. Therefore, as shown in FIG. 4(a), 2 symbols are added to the null (or dummy) symbol, thereby creating the interleaving pattern. Equation 1 shown below describes the process of sequentially receiving K number of symbols, the order of which is to be rearranged, and obtaining an L value satisfying the conditions of $L=2^n$ (wherein n is an integer) and of $L \geq K$, thereby creating the interleaving so as to realign (or rearrange) the symbol order.

In relation to all places, wherein $0 \leq i \leq L-1$, $$P(i) = \{S \times i \times (i+1)/2\} \bmod L \quad \text{Equation 1}$$

Herein, $L \geq K$, $L=2^n$, and n and S are integers. Referring to FIG. 4, it is assumed that S is equal to 89, and that L is equal to 8, and FIG. 4 illustrates the created interleaving pattern and an example of the interleaving process. As shown in FIG. 4(b), the order of K number of input symbols and (L−K) number of null symbols is rearranged by using the above-mention Equation 1. Then, as shown in FIG. 4(c), the null byte places are removed, so as to rearrange the order, by using Equation 2 shown below. Thereafter, the symbol that is interleaved by the rearranged order is then outputted to the symbol-byte converter 214.

if $$P(i) > K-1, \quad \text{Equation 2}$$

then P(i) place is removed and rearranged

Subsequently, the symbol-byte converter 214 groups the mobile service data symbols, having the rearranging of the symbol order completed by the block interleaver 213 and then outputted in accordance with the rearranged order, thereby configuring mobile service data bytes. Thereafter, the symbol-byte converter 214 outputs the newly configured bytes to the block formatter 220. More specifically, the symbol-byte converter 214 groups 4 mobile service data symbols outputted from the block interleaver 213 so as to configure 1 mobile service data byte.

Figure 5:
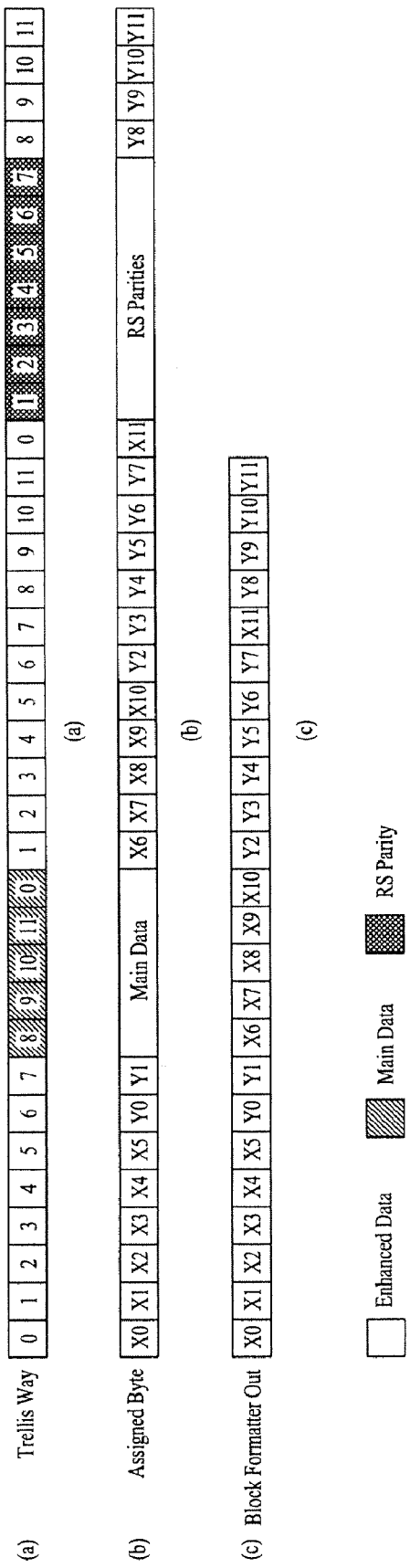
FIG. 5(a) to FIG. 5(c) illustrate block encoding and trellis encoding processes according to an embodiment of the present invention.

As shown in FIG. 5, the block formatter 220 performs the process of aligning the output of each symbol-byte converter 212 and 214 within the block in accordance with a set standard. Herein, the block formatter 220 operates in association with the trellis encoding module 127. More specifically, the block formatter 220 decides the output order of the mobile service data outputted from each symbol-byte converter 212 and 214 while taking into consideration the place (or order) of the data excluding the mobile service data that are being inputted, such data include main service data, known data, RS parity data, and MPEG header data.

Figure 6:
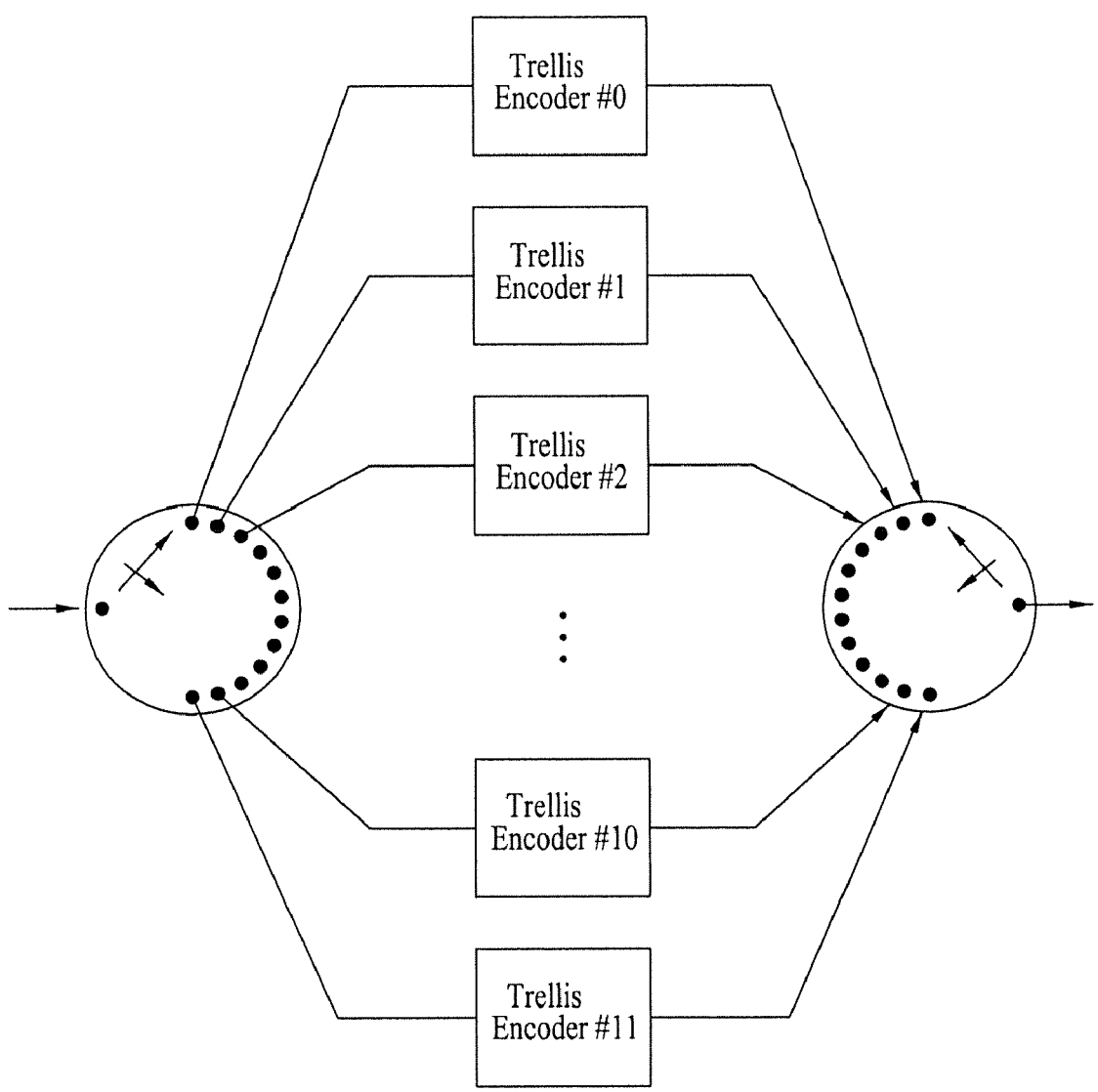
FIG. 6 illustrates a detailed block diagram of a trellis encoding module according to the present invention.

According to the embodiment of the present invention, the trellis encoding module 127 is provided with trellis encoders. FIG. 6 illustrates a block diagram showing the trellis encoding module 127 according to the present invention. In the example shown in FIG. 6, 12 identical trellis encoders are combined to the interleaver in order to disperse noise. Herein, each trellis encoder may be provided with a pre-coder.

Figure 7A:
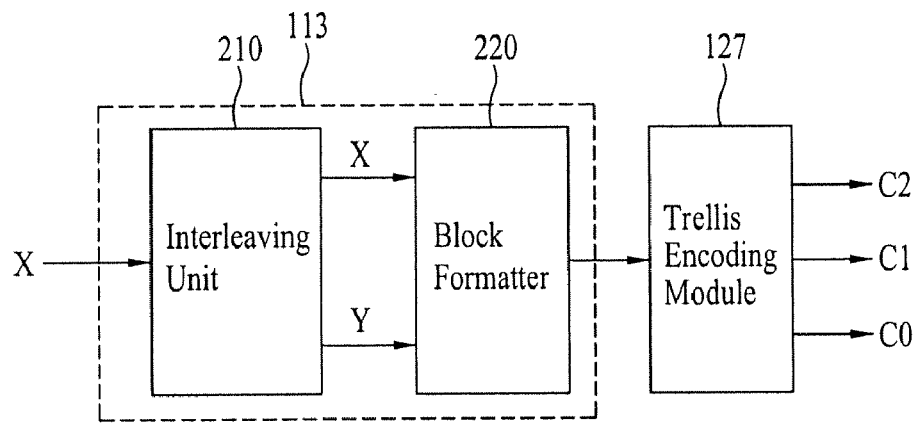
FIG. 7A and FIG. 7B respectively illustrate concatenation between a block processor and a trellis encoding module according to the present invention.
Figure 7B:
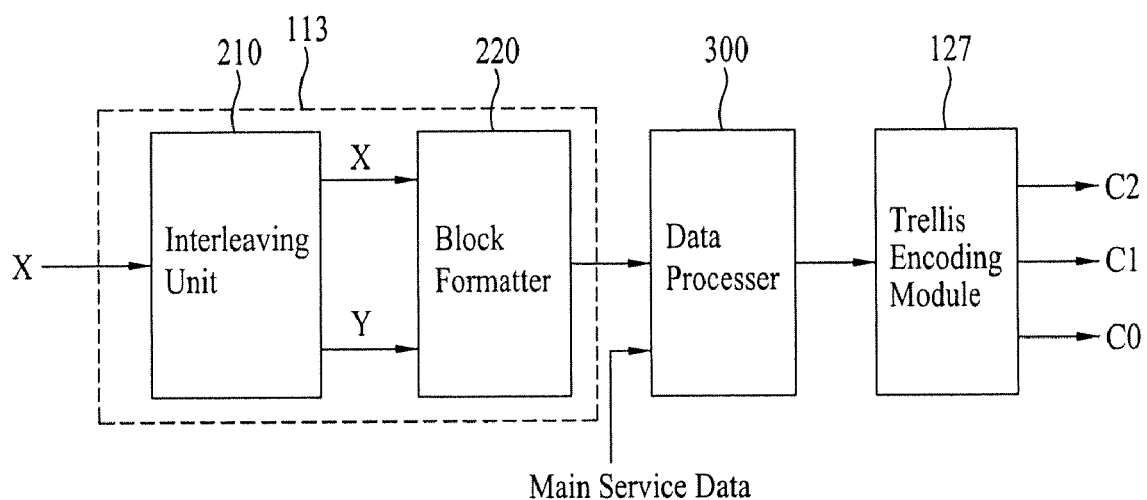

FIG. 7A illustrates the block processor 113 being concatenated with the trellis encoding module 127. In the transmitting system, a plurality of blocks actually exists between the block processor 113 and the trellis encoding module 127, as shown in FIG. 1. Conversely, the receiving system considers the block processor 113 to be concatenated with the trellis encoding module 127, thereby performing the decoding process accordingly. However, the data excluding the mobile service data that are being inputted to the trellis encoding module 127, wherein the data excluding mobile service data include main service data, known data, RS parity data, and MPEG header data, correspond to data that are added to the blocks existing between the block processor 113 and the trellis encoding module 127. FIG. 7B illustrates an example of a data processor 300 being positioned between the block processor 113 and the trellis encoding module 127, while taking the above-described instance into consideration.

Herein, when the interleaving unit 210 of the block processor 113 performs a ½-rate encoding process, the interleaving unit 210 may be configured as shown in FIG. 2A (or FIG. 2B). Referring to FIG. 1, for example, the data processor 300 may include a group formatter 114, a data deinterleaver 115, a packet formatter 116, a packet multiplexer 121, a modified data randomizer 122, a RS encoder/non-systematic RS encoder 123, a data interleaver 124, a parity replacer 125, and a non-systematic RS encoder 126.

At this point, the trellis encoding module 127 symbolizes the data that are being inputted so as to divide the symbolized data and to send the divided data to each trellis encoder in accordance with a pre-defined method. Herein, one byte is converted into 4 symbols, each being configured of 2 bits. Also, the symbols created from the single data byte are all transmitted to the same trellis encoder. Accordingly, each trellis encoder pre-codes an upper bit of the input symbol, which is then outputted as the uppermost output bit C2. Alternatively, each trellis encoder trellis-encodes a lower bit of the input symbol, which is then outputted as two output bits C1 and C0. The block formatter 220 is controlled so that the data byte outputted from each symbol-byte converter can be transmitted to different trellis encoders.

Hereinafter, the operation of the block formatter 220 will now be described in detail with reference to FIG. 2, FIG. 5 to FIG. 7. Referring to FIG. 2A, for example, the data byte outputted from the symbol-byte converter 212 and the data byte outputted from the symbol-byte converter 214 are inputted to different trellis encoders of the trellis encoding module 127 in accordance with the control of the block formatter 220. Hereinafter, the data byte outputted from the symbol-byte converter 212 will be referred to as X, and the data byte outputted from the symbol-byte converter 214 will be referred to as Y, for simplicity. Referring to FIG. 5(a), each number (i.e., 0 to 11) indicates the first to twelfth trellis encoders of the trellis encoding module 127, respectively.

In addition, the output order of both symbol-byte converters are arranged (or aligned) so that the data bytes outputted from the symbol-byte converter 212 are respectively inputted to the $0^{th}$ to $5^{th}$ trellis encoders (0 to 5) of the trellis encoding module 127, and that the data bytes outputted from the symbol-byte converter 214 are respectively inputted to the $6^{th}$ to $11^{th}$ trellis encoders (6 to 11) of the trellis encoding module 127. Herein, the trellis encoders having the data bytes outputted from the symbol-byte converter 212 allocated therein, and the trellis encoders having the data bytes outputted from the symbol-byte converter 214 allocated therein are merely examples given to simplify the understanding of the present invention. Furthermore, according to an embodiment of the present invention, and assuming that the input data of the block processor 113 correspond to a block configured of 12 bytes, the symbol-byte converter 212 outputs 12 data bytes from X0 to X11, and the symbol-byte converter 214 outputs 12 data bytes from Y0 to Y11.

FIG. 5(b) illustrates an example of data being inputted to the trellis encoding module 127. Particularly, FIG. 5(b) illustrates an example of not only the mobile service data but also the main service data and RS parity data being inputted to the trellis encoding module 127, so as to be distributed to each trellis encoder. More specifically, the mobile service data outputted from the block processor 113 pass through the group formatter 114, from which the mobile service data are mixed with the main service data and RS parity data and then outputted, as shown in FIG. 5(a). Accordingly, each data byte is respectively inputted to the 12 trellis encoders in accordance with the positions (or places) within the data group after being data-interleaved.

Herein, when the output data bytes X and Y of the symbol-byte converters 212 and 214 are allocated to each respective trellis encoder, the input of each trellis encoder may be configured as shown in FIG. 5(b). More specifically, referring to FIG. 5(b), the six mobile service data bytes (X0 to X5) outputted from the symbol-byte converter 212 are sequentially allocated (or distributed) to the first to sixth trellis encoders (0 to 5) of the trellis encoding module 127. Also, the 2 mobile service data bytes Y0 and Y1 outputted from the symbol-byte converter 214 are sequentially allocated to the $7^{th}$ and $8^{th}$ trellis encoders (6 and 7) of the trellis encoding module 127. Thereafter, among the 5 main service data bytes, 4 data bytes are sequentially allocated to the $9^{th}$ and $12^{th}$ trellis encoders (8 to 11) of the trellis encoding module 127. Finally, the remaining 1 byte of the main service data byte is allocated once again to the first trellis encoder (0).

It is assumed that the mobile service data, the main service data, and the RS parity data are allocated to each trellis encoder, as shown in FIG. 5(b). It is also assumed that, as described above, the input of the block processor 113 is configured of 12 bytes, and that 12 bytes from X0 to X11 are outputted from the symbol-byte converter 212, and that 12 bytes from Y0 to Y11 are outputted from the symbol-byte converter 214. In this case, as shown in FIG. 5(c), the block formatter 220 arranges the data bytes that are to be outputted from the symbol-byte converters 212 and 214 by the order of X0 to X5, Y0, Y1, X6 to X10, Y2 to Y7, X11, and Y8 to Y11. More specifically, the trellis encoder that is to perform the encoding process is decided based upon the position (or place) within the transmission frame in which each data byte is inserted. At this point, not only the mobile service data but also the main service data, the MPEG header data, and the RS parity data are also inputted to the trellis encoding module 127. Herein, it is assumed that, in order to perform the above-described operation, the block formatter 220 is informed of (or knows) the information on the data group format after the data-interleaving process.

Figure 8:
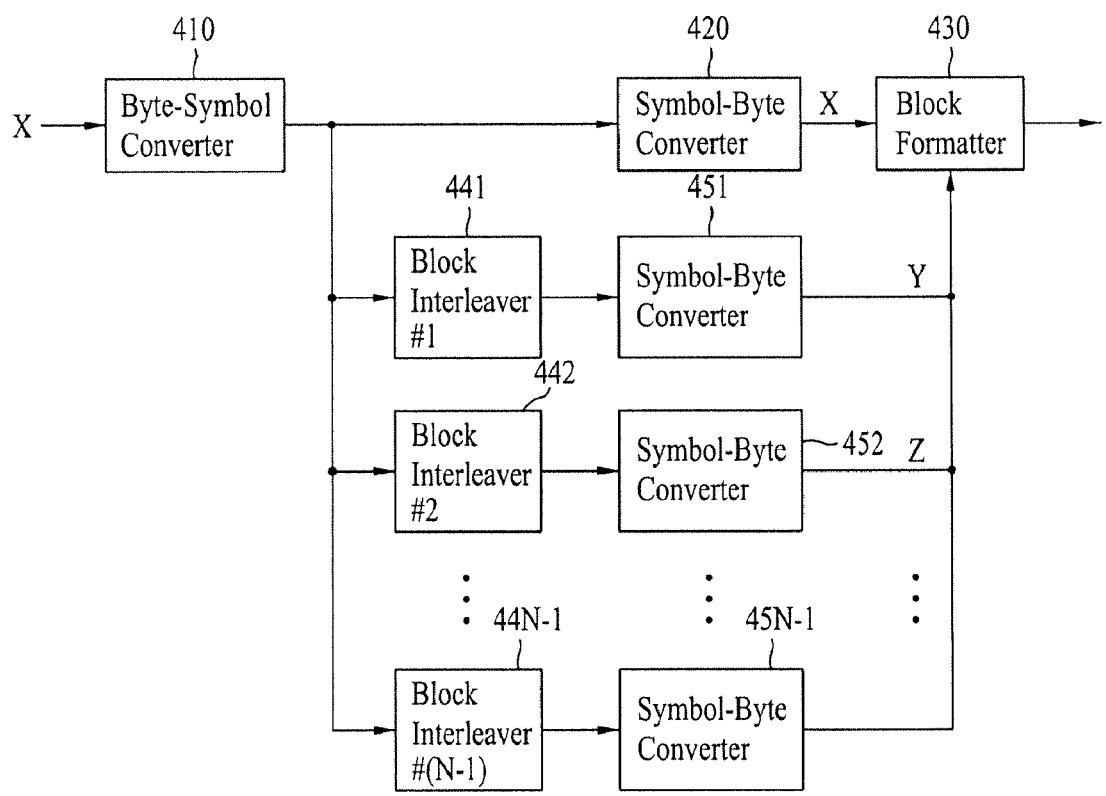
FIG. 8 illustrates a block processor according to another embodiment of the present invention.

FIG. 8 illustrates a block diagram of the block processor performing an encoding process at a coding rate of 1/N according to an embodiment of the present invention. Herein, the block processor includes (N−1) number of block interleavers 441 to 44N−1, which are configured in a parallel structure. More specifically, the block processor having the coding rate of 1/N consists of a total of N number of branches (or paths) including a branch (or path), which is directly transmitted to the block formatter 430. In addition, the block interleaver 441 to 44N−1 of each branch may each be configured of a different block interleaver structure. Furthermore, (N−1) number of symbol-byte converter 451 to 45N−1 each corresponding to each (N−1) number of block interleavers 441 to 44N−1 may be included at the end of each block interleaver, respectively. Herein, the output data of the (N−1) number of symbol-byte converter 451 to 45N−1 are also inputted to the block formatter 430.

In the example of the present invention, N is equal to or smaller than 12. If N is equal to 12, the block formatter 430 may align the output data so that the output byte of the $12^{th}$ symbol-byte converter 45N−1 is inputted to the $12^{th}$ trellis encoder. Alternatively, if N is equal to 3, the block formatter 430 may arranged the output order, so that the data bytes outputted from the symbol-byte converter 420 are inputted to the $1^{st}$ to $4^{th}$ trellis encoders of the trellis encoding module 127, and that the data bytes outputted from the symbol-byte converter 451 are inputted to the $5^{th}$ to $8^{th}$ trellis encoders, and that the data bytes outputted from the symbol-byte converter 452 are inputted to the $9^{th}$ to $12^{th}$ trellis encoders. At this point, the order of the data bytes outputted from each symbol-byte converter may vary in accordance with the position within the data group of the data other than the mobile service data, which are mixed with the mobile service data that are outputted from each symbol-byte converter.

Figure 9:
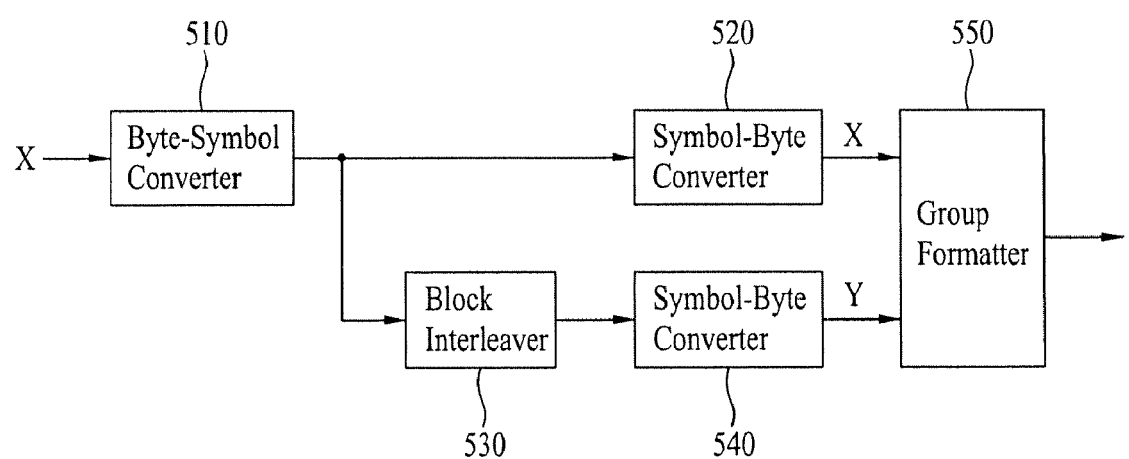
FIG. 9 illustrates a block processor according to yet another embodiment of the present invention.

FIG. 9 illustrates a detailed block diagram showing the structure of a block processor encoding data at a coding rate of ½ according to another embodiment of the present invention. Herein, the block formatter is removed from the block processor so that the operation of the block formatter may be performed by a group formatter. More specifically, the block processor of FIG. 9 may include a byte-symbol converter 510, symbol-byte converters 520 and 540, and a block interleaver 530. In this case, the output of each symbol-byte converter 520 and 540 is inputted to the group formatter 550.

Also, a desired coding rate may be obtained by adding block interleavers and symbol-byte converters. If the system designer wishes a coding rate of 1/N, the block processor needs to be provided with a total of N number of branches (or paths) including a branch (or path), which is directly transmitted to the block formatter 550, and (N−1) number of block interleavers and symbol-byte converters configured in a parallel structure with (N−1) number of branches. At this point, the group formatter 550 inserts place holders ensuring the positions (or places) for the MPEG header, the non-systematic RS parity, and the main service data. And, at the same time, the group formatter 550 positions the data bytes outputted from each branch of the block processor.

The number of trellis encoders, the number of symbol-byte converters, and the number of block interleavers proposed in the present invention are merely exemplary. And, therefore, the corresponding numbers do not limit the spirit or scope of the present invention. It is apparent to those skilled in the art that the type and position of each data byte being allocated to each trellis encoder of the trellis encoding module 127 may vary in accordance with the data group format. Therefore, the present invention should not be understood merely by the examples given in the description set forth herein. The mobile service data that are encoded at a coding rate of 1/N and outputted from the block processor 113 are inputted to the group formatter 114. Herein, in the example of the present invention, the order of the output data outputted from the block formatter of the block processor 113 are aligned and outputted in accordance with the position of the data bytes within the data group.

Meanwhile, the group formatter 114 inserts mobile service data (wherein the mobile service data may include supplemental information such as signaling data including transmission information) that are outputted from the block processor 113 in corresponding regions within a data group, which is configured in accordance with a pre-defined rule. Also, with respect to the data deinterleaving process, each place holder or known data are also inserted in corresponding regions within the data group. At this point, the data group may be divided into at least one hierarchical region. Herein, the type of mobile service data being inserted to each region may vary depending upon the characteristics of each hierarchical region. For example, each region may be divided based upon the receiving performance within the data group. Also, a data group may be configured to include field synchronization signals.

In an example given in the present invention, a data group is divided into A, B, and C regions in a data configuration prior to data deinterleaving. At this point, the group formatter 114 allocates the mobile service data, which are inputted after being RS encoded and block encoded, to each of the corresponding regions by referring to the transmission parameter.

Figure 10:
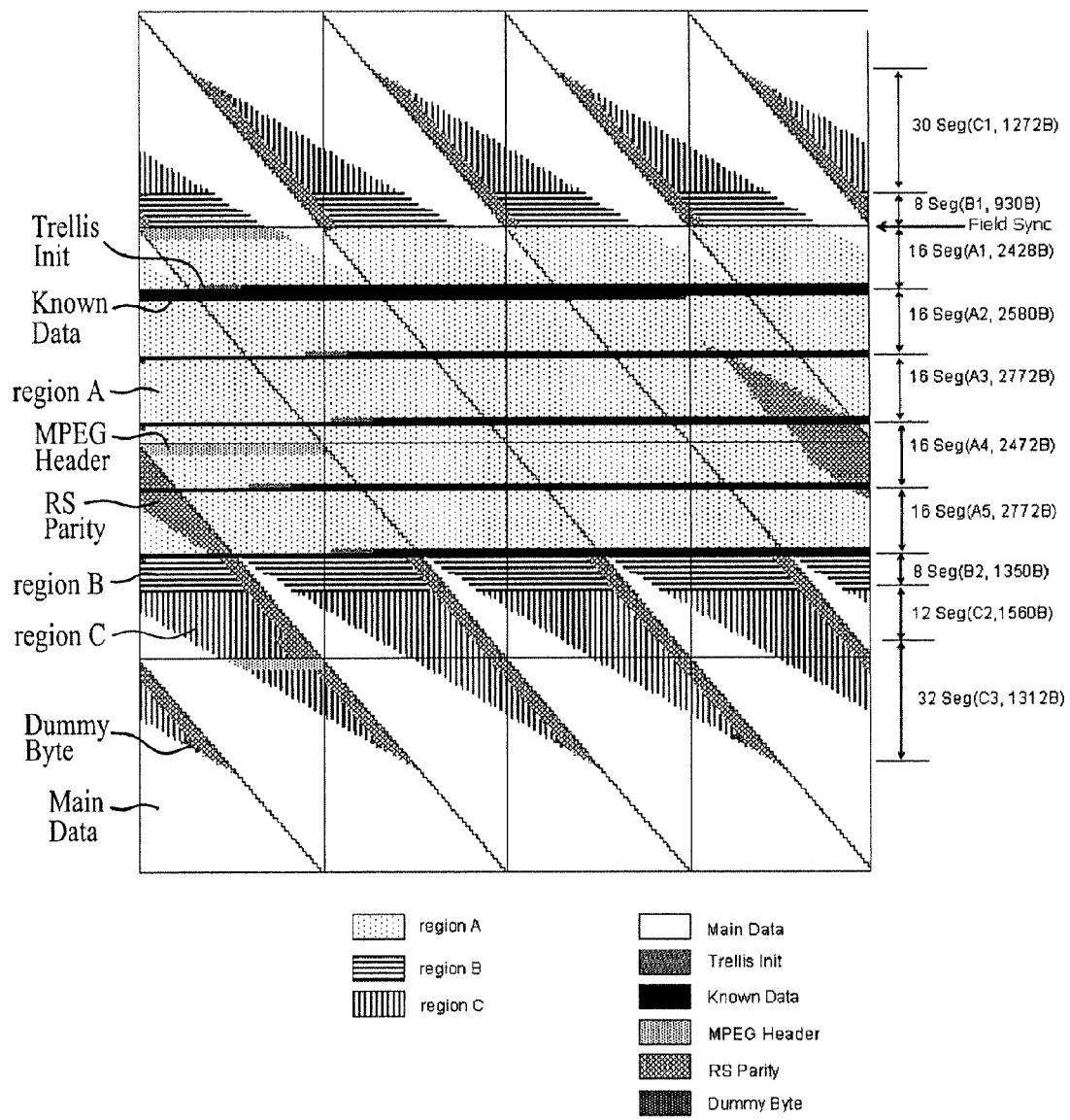
FIG. 10 and FIG. 11 illustrate data configuration before and after a data deinterleaver in a transmitting system according to the present invention.
Figure 11:
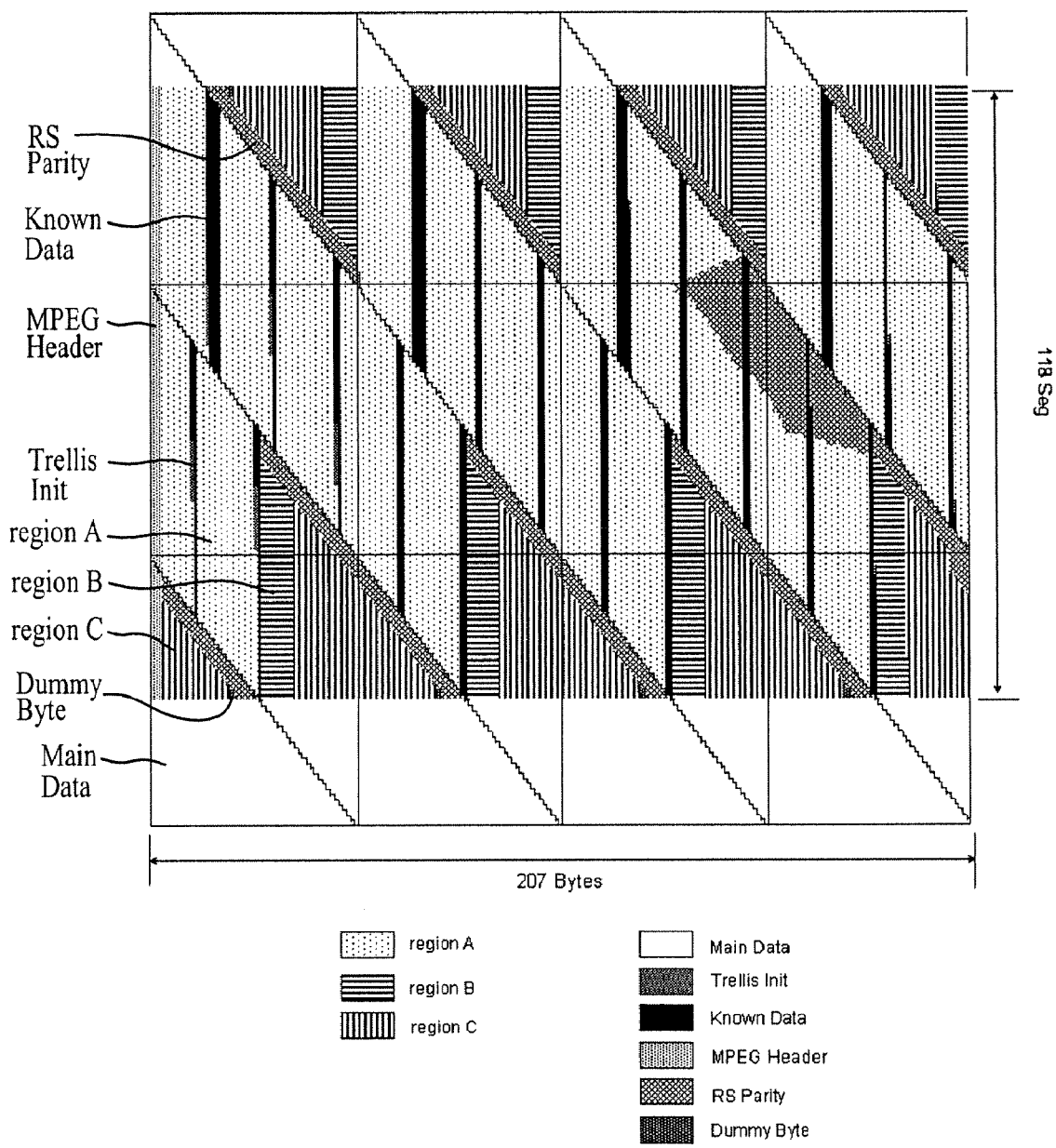

FIG. 10 illustrates an alignment of data after being data interleaved and identified, and FIG. 11 illustrates an alignment of data before being data interleaved and identified. More specifically, a data structure identical to that shown in FIG. 10 is transmitted to a receiving system. Also, the data group configured to have the same structure as the data structure shown in FIG. 10 is inputted to the data deinterleaver 115.

As described above, FIG. 10 illustrates a data structure prior to data deinterleaving that is divided into 3 regions, such as region A, region B, and region C. Also, in the present invention, each of the regions A to C is further divided into a plurality of regions. Referring to FIG. 10, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of mobile service data, which are inputted, may also vary depending upon the characteristic of each region.

In the example of the present invention, the data structure is divided into regions A to C based upon the level of interference of the main service data. Herein, the data group is divided into a plurality of regions to be used for different purposes. More specifically, a region of the main service data having no interference or a very low interference level may be considered to have a more resistant (or robust) receiving performance as compared to regions having higher interference levels. Additionally, when using a system inserting and transmitting known data in the data group, and when consecutively long known data are to be periodically inserted in the mobile service data, the known data having a predetermined length may be periodically inserted in the region having no interference from the main service data (e.g., region A). However, due to interference from the main service data, it is difficult to periodically insert known data and also to insert consecutively long known data to a region having interference from the main service data (e.g., region B and region C).

Hereinafter, examples of allocating data to region A (A1 to A5), region B (B1 and B2), and region C (C1 to C3) will now be described in detail with reference to FIG. 10. The data group size, the number of hierarchically divided regions within the data group and the size of each region, and the number of mobile service data bytes that can be inserted in each hierarchically divided region of FIG. 10 are merely examples given to facilitate the understanding of the present invention. Herein, the group formatter 114 creates a data group including places in which field synchronization data bytes are to be inserted, so as to create the data group that will hereinafter be described in detail.

More specifically, region A includes A2 to A5 regions within the data group in which a long known data sequence may be periodically inserted, and in which includes regions wherein the main service data are not mixed. Also, region A includes an A1 region located between a field synchronization region and the region in which the first known data sequence is to be inserted. The field synchronization region has the length of one segment (i.e., 832 symbols) existing in an ATSC system.

For example, referring to FIG. 10, 2428 bytes of the mobile service data may be inserted in the region A1, 2580 bytes may be inserted in the region A2, 2772 bytes may be inserted in the region A3, 2472 bytes may be inserted in the region A4, and 2772 bytes may be inserted in the region A5. Herein, trellis initialization data or known data, MPEG header, and RS parity are not included in the mobile service data. As described above, when region A includes a known data sequence at both ends, the receiving system uses channel information that can obtain known data or field synchronization data, so as to perform equalization, thereby providing enforced equalization performance.

Also, region B includes a B1 region located within 8 segments at the beginning of a field synchronization region within the data group (chronologically placed before region A1), and a B2 region located within 8 segments behind the very last known data sequence which is inserted in the data group. For example, 930 bytes of the mobile service data may be inserted in the region B1, and 1350 bytes may be inserted in the region B2. Similarly, trellis initialization data or known data, MPEG header, and RS parity are not included in the mobile service data. In case of region B, the receiving system may perform equalization by using channel information obtained from the field synchronization region. Alternatively, the receiving system may also perform equalization by using channel information that may be obtained from the last known data sequence, thereby enabling the system to respond to the channel changes.

Region C includes a C1 region located within 30 segments including and preceding the $9^{th}$ segment of the field synchronization region (chronologically located before region A), a C2 region located within 12 segments including and following the $9^{th}$ segment of the very last known data sequence within the data group (chronologically located after region A), and a C3 region located in 32 segments after the region C2. For example, 1272 bytes of the mobile service data may be inserted in the region C1, 1560 bytes may be inserted in the region C2, and 1312 bytes may be inserted in the region C3. Similarly, trellis initialization data or known data, MPEG header, and RS parity are not included in the mobile service data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

Furthermore, apart from the additionally encoded mobile service data outputted from the block processor 113, the group formatter 114 also inserts MPEG header place holders, non-systematic RS parity place holders, main service data place holders, which are related to data deinterleaving in a later process. Herein, the main service data place holders are inserted because the mobile service data bytes and the main service data bytes are alternately mixed with one another based upon the input of the data deinterleaver. For example, based upon the data outputted after the data-deinterleaving process, the place holder for the MPEG header may be allocated at the very beginning of each packet.

Furthermore, the group formatter 114 either inserts known data generated in accordance with a pre-determined method or inserts known data place holders for inserting the known data in a later process. Additionally, place holders for initializing the trellis encoding module 127 are also inserted in the corresponding regions. For example, the initialization data place holders may be inserted in the beginning of the known data sequence. Herein, the size of the mobile service data that can be inserted in a data group may vary in accordance with the sizes of the trellis initialization data or known data, MPEG headers, and RS parity data.

The data outputted from the group formatter 114 are inputted to the data deinterleaver 115. And, the data deinterleaver 115 deinterleaves data by performing an inverse process of the data interleaver on the data and place holders within the data group outputted from the group formatter 114. Then, the deinterleaved data are outputted to the packet formatter 116. The packet formatter 116 removes the main service data place holders and the RS parity place holders that were allocated for the deinterleaving process from the deinterleaved data being inputted. Then, the packet formatter 116 groups the remaining portion and replaces the 4-byte MPEG header place holder with an MPEG. Also, when the group formatter 114 inserts known data place holders, the packet formatter 116 may insert actual known data in the known data place holders, or may directly output the known data place holders without any modification in order to make replacement insertion in a later process. Thereafter, the packet formatter 116 identifies the data within the packet-formatted data group, as described above, as a 188-byte unit mobile service data packet (i.e., MPEG TS packet), which is then provided to the packet multiplexer 121.

The packet multiplexer 121 multiplexes the mobile service data packet outputted from the packet formatter 116 and the main service data in accordance with a pre-defined multiplexing method. Then, the packet multiplexer 121 outputs the multiplexed data packets to the modified data randomizer 122. Herein, the multiplexing method may vary in accordance with various variables of the system design. One of the multiplexing methods of the packet multiplexer 121 consists of distinguishing (or identifying) a mobile service data burst section and a main service data burst section and providing the distinguished burst sections along a time axis, so that the two burst sections can be alternately repeated. At this point, the mobile service burst section may be set to transmit at least one data group, and the main service data burst section may be set to transmit only main service data. Herein, the mobile service data burst section may also transmit the main service data.

When the mobile service data are transmitted in burst units, as described above, a receiving system that only receives the mobile service data may turn on the power only during the mobile service data burst section so as to receive the corresponding data. Also, in this case, the receiving system may turn off the power during the main service data burst sections, thereby preventing the main service data from being received. Thus, the receiving system is capable of reducing excessive power consumption.

If the inputted data correspond to the main service data packet, the modified data randomizer 122 performs the same randomizing process as that of the conventional randomizer. More specifically, the MPEG synchronization byte within the main service data packet is deleted. Then, the remaining 187 data bytes are randomized by using a pseudo random byte generated from the modified data randomizer 122. Thereafter, the randomized data are outputted to the RS encoder/non-systematic RS encoder 123. On the other hand, if the inputted data correspond to the mobile service data packet, the modified data randomizer 122 deletes the MPEG synchronization byte from the 4-byte MPEG header included in the mobile service data packet and, then, performs the randomizing process only on the remaining 3 data bytes of the MPEG header. Thereafter, the randomized data bytes are outputted to the RS encoder/non-systematic RS encoder 123.

Additionally, the randomizing process is not performed on the remaining portion of the mobile service data excluding the MPEG header. In other words, the remaining portion of the mobile service data packet is directly outputted to the RS encoder/non-systematic RS encoder 123 without being randomized. This is because a randomizing process has already been performed on the mobile service data in the data randomizer 111. Also, the data randomizer 261 may or may not perform a randomizing process on the known data (or known data place holders) and the initialization data place holders included in the mobile service data packet.

The RS encoder/non-systematic RS encoder 123 performs an RS encoding process on the data being randomized by the modified data randomizer 122 or on the data bypassing the modified data randomizer 122, so as to add 20 bytes of RS parity data. Thereafter, the processed data are outputted to the data interleaver 124. Herein, if the inputted data correspond to the main service data packet, the RS encoder/non-systematic RS encoder 123 performs the same systematic RS encoding process as that of the conventional VSB system, thereby adding the 20-byte RS parity data at the end of the 187-byte data. Alternatively, if the inputted data correspond to the mobile service data packet, the RS encoder/non-systematic RS encoder 123 performs a non-systematic RS encoding process. At this point, the 20-byte RS parity data obtained from the non-systematic RS encoding process are inserted in a pre-decided parity byte place within the mobile service data packet.

The data interleaver 124 corresponds to a byte unit convolutional interleaver. The output of the data interleaver 124 is inputted to the parity replacer 125 and to the non-systematic RS encoder 126. Meanwhile, a process of initializing a memory within the trellis encoding module 127 is primarily required in order to decide the output data of the trellis encoding module 127, which is located after the parity replacer 125, as the known data pre-defined according to an agreement between the receiving system and the transmitting system. More specifically, the memory of the trellis encoding module 127 should first be initialized before the received known data sequence is trellis-encoded. At this point, the beginning portion of the known data sequence that is received corresponds to the initialization data place holder and not to the actual known data. Herein, the initialization data place holder has been included in the data by the group formatter 114 in an earlier process. Therefore, the process of generating initialization data and replacing the initialization data place holder of the corresponding memory with the generated initialization data are required to be performed immediately before the inputted known data sequence is trellis-encoded.

Additionally, a value of the trellis memory initialization data is decided and generated based upon a memory status of the trellis encoding module 127. Further, due to the newly replaced initialization data, a process of newly calculating the RS parity and replacing the RS parity, which is outputted from the data interleaver 124, with the newly calculated RS parity is required. Therefore, the non-systematic RS encoder 126 receives the mobile service data packet including the initialization data place holders, which are to be replaced with the actual initialization data, from the data interleaver 124 and also receives the initialization data from the trellis encoding module 127.

Among the inputted mobile service data packet, the initialization data place holders are replaced with the initialization data, and the RS parity data that are added to the mobile service data packet. Thereafter, a new non-systematic RS parity is calculated and then outputted to the parity replacer 125. Accordingly, the parity replacer 125 selects the output of the data interleaver 124 as the data within the mobile service data packet, and the parity replacer 125 selects the output of the non-systematic RS encoder 126 as the RS parity data. Then, the selected data are outputted to the trellis encoding module 127.

Meanwhile, if the main service data packet is inputted or if the mobile service data packet, which does not include any initialization data place holders that are to be replaced, is inputted, the parity replacer 125 selects the data and RS parity that are outputted from the data interleaver 124. Then, the parity replacer 125 directly outputs the selected data to the trellis encoding module 127 without any modification. The trellis encoding module 127 converts the byte-unit data to symbol units and performs a 12-way interleaving process so as to trellis-encode the received data. Thereafter, the processed data are outputted to the frame multiplexer 128. The frame multiplexer 128 inserts a field synchronization signal and a segment synchronization signal to the data outputted from the trellis encoding module 127 and, then, outputs the processed data to the transmission unit 130. Herein, the transmission unit 130 includes a pilot inserter 131, a modulator 132, and a radio frequency (RF) up-converter 133. Since the operations and role of the transmission unit 130 is identical to that used in the conventional transmitter (or transmitting system), a detailed description of the transmission unit 130 will be omitted for simplicity.

Figure 12:
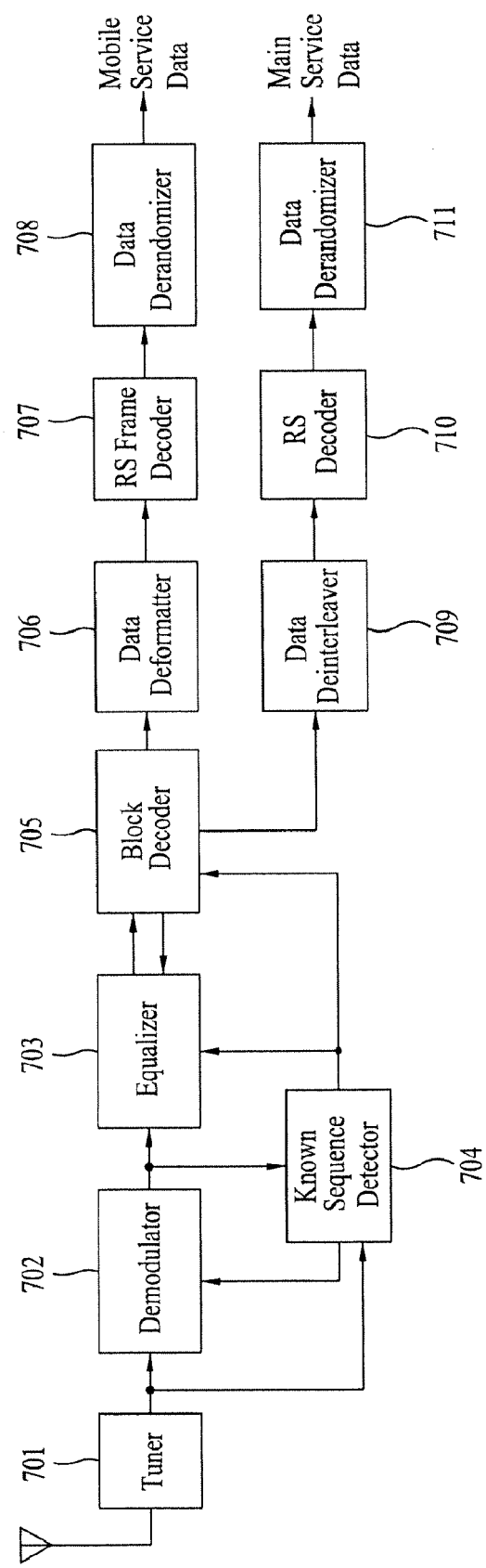
FIG. 12 illustrates a block diagram showing a structure of a receiving system according to an embodiment of the present invention.

FIG. 12 illustrates a block diagram showing a structure of a receiving system according to an embodiment of the present invention. The receiving system of FIG. 12 uses known data information, which is inserted in the mobile service data section and transmitted by the transmitting system, so as to perform carrier synchronization recovery, frame synchronization recovery, and channel equalization, thereby enhancing the receiving performance. Referring to FIG. 12, the receiving system includes a tuner 701, a demodulator 702, an equalizer 703, a known data detector (or known sequence detector) 704, a block decoder 705, a data deformatter 706, a RS frame decoder 707, a data derandomizer 708, a data deinterleaver 709, a RS decoder 710, and a data derandomizer 711. Herein, for simplicity of the description of the present invention, the data deformatter 706, the RS frame decoder 707, and the data derandomizer 708 will be collectively referred to as a mobile service data processing unit. And, the data deinterleaver 709, the RS decoder 710, and the data derandomizer 711 will be collectively referred to as a main service data processing unit.

More specifically, the tuner 701 tunes a frequency of a particular channel and down-converts the tuned frequency to an intermediate frequency (IF) signal. Then, the tuner 701 outputs the down-converted IF signal to the demodulator 702 and the known sequence detector 704. The demodulator 702 performs self gain control, carrier recovery, and timing recovery processes on the inputted IF signal, thereby modifying the IF signal to a baseband signal. The equalizer 703 compensates the distortion of the channel included in the demodulated signal and then outputs the error-compensated signal to the block decoder 705.

At this point, the known sequence detector 704 detects the known sequence place inserted by the transmitting end from the input/output data of the demodulator 702 (i.e., the data prior to the demodulation process or the data after the demodulation process). Thereafter, the place information (or position indicator) along with the symbol sequence of the known data, which are generated from the detected place, is outputted to the demodulator 702 and the equalizer 703. Also, the known sequence detector 704 outputs a set of information to the block decoder 705. This set of information is used to allow the block decoder 705 of the receiving system to identify the mobile service data that are processed with additional encoding by the transmitting system and the main service data that are not processed with additional encoding. This set of information also indicates the starting (or beginning) point of a block.

In addition, although the connection status is not shown in FIG. 12, the information detected from the known sequence detector 704 may be used throughout the entire receiving system and may also be used in the data deformatter 706 and the RS frame decoder 707. The demodulator 702 uses the known data (or sequence) position indicator and the known data symbol sequence during the timing and/or carrier recovery, thereby enhancing the demodulating performance. Similarly, the equalizer 703 uses the known sequence position indicator and the known data symbol sequence so as to enhance the equalizing performance. Moreover, the decoding result of the block decoder 705 may be fed-back to the equalizer 703, thereby enhancing the equalizing performance.

The equalizer 703 may perform channel equalization by using a plurality of methods. An example of estimating a channel impulse response (CIR) in the field synchronization section and the known data section, so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Meanwhile, if the data being inputted to the block decoder 705 after being channel equalized from the equalizer 703 correspond to the mobile service data having additional encoding and trellis encoding performed thereon by the transmitting system, trellis decoding and additional decoding processes are performed on the inputted data as inverse processes of the transmitting system. Alternatively, if the data being inputted to the block decoder 705 correspond to the main service data having only trellis encoding performed thereon, and not the additional encoding, only the trellis decoding process is performed on the inputted data as the inverse process of the transmitting system. The data group decoded by the block decoder 705 is inputted to the data deformatter 706, and the main service data packet is inputted to the data deinterleaver 709.

More specifically, if the inputted data correspond to the main service data, the block decoder 705 performs Viterbi decoding on the inputted data so as to output a hard decision value or to perform a hard-decision on a soft decision value, thereby outputting the result. Meanwhile, if the inputted data correspond to the mobile service data, the block decoder 705 outputs a hard decision value or a soft decision value with respect to the inputted mobile service data. At this point, it is preferable for the block decoder 705 to output the soft decision value in order to enhance the performance of the error correction decoding process additionally performed by the mobile service data processing unit on the mobile service data. Accordingly, the mobile service data processing unit receives the soft decision value, thereby performing the additional error correction decoding process. Herein, a RS decoder, a convolutional decoder, a low density parity check (LDPC) code decoder, and so on may be used as the decoder performing the error correction decoding process. Alternatively, turbo decoding may be performed among a plurality of decoders.

In other words, if the inputted data correspond to the mobile service data, the block decoder 705 performs a decoding process on the data encoded by the block processor and trellis encoding module of the transmitting system. At this point, the RS frame encoder of the pre-processor included in the transmitting system may be viewed as an external code. And, the block processor and the trellis encoder may be viewed as an internal code. In order to maximize the performance of the external code when decoding such concatenated codes, the decoder of the internal code should output a soft decision value. Therefore, the block decoder 705 may output a hard decision value on the mobile service data. However, when required, it may be more preferable for the block decoder 705 to output a soft decision value.

The data being outputted from the block decoder 705 to the data deformatter 706 are inputted in the form of a data group. At this point, the data deformatter 706 already knows the structure of the data that are to be inputted and is, therefore, capable of identifying the signaling information, which includes the system information, and the mobile service data from the data group. Thereafter, the data deformatter 706 outputs the identified signaling information to a block for system information and outputs the identified mobile service data to the RS frame decoder 707. At this point, the data deformatter 706 removes the known data, trellis initialization data, and MPEG header that were inserted in the main service data and data group. The data deformatter 706 also removes the RS parity that was added by the RS encoder/non-systematic RS encoder or the non-systematic RS encoder of the transmitting system. Thereafter, the processed data are outputted to the RS frame decoder 707. More specifically, the RS frame decoder 707 receives only the RS encoded and CRC encoded mobile service data that are transmitted from the data deformatter 706.

The RS frame encoder 707 performs an inverse process of the RS frame encoder included in the transmitting system so as to correct the error within the RS frame. Then, the RS frame decoder 707 adds the 1-byte MPEG synchronization service data packet, which had been removed during the RS frame encoding process, to the error-corrected mobile service data packet. Thereafter, the processed data packet is outputted to the data derandomizer 708. The data derandomizer 708 performs a derandomizing process, which corresponds to the inverse process of the randomizer included in the transmitting system, on the received mobile service data. Thereafter, the derandomized data are outputted, thereby obtaining the mobile service data transmitted from the transmitting system.

Meanwhile, the data deinterleaver 709, the RS decoder 710, and the data derandomizer 711 are blocks required for receiving the main service data. Therefore, the above-mentioned blocks may not be required in the structure of a receiving system that only receives the mobile service data. The data deinterleaver 709 performs an inverse process of the data interleaver included in the transmitting system. In other words, the data deinterleaver 709 deinterleaves the main service data outputted from the block decoder 705 and outputs the deinterleaved main service data to the RS decoder 710. The RS decoder 710 performs a systematic RS decoding process on the deinterleaved data and outputs the processed data to the data derandomizer 711. The data derandomizer 711 receives the output of the RS decoder 710 and generates a pseudo random data byte identical to that of the randomizer included in the transmitting system. Thereafter, the data derandomizer 711 performs a bitwise exclusive OR (XOR) operation on the generated pseudo random data byte, thereby inserting the MPEG synchronization bytes to the beginning of each packet so as to output the data in 188-byte main service data packet units.

Hereinafter, the operations of the block decoder 705 will be described in detail.

Figure 13:
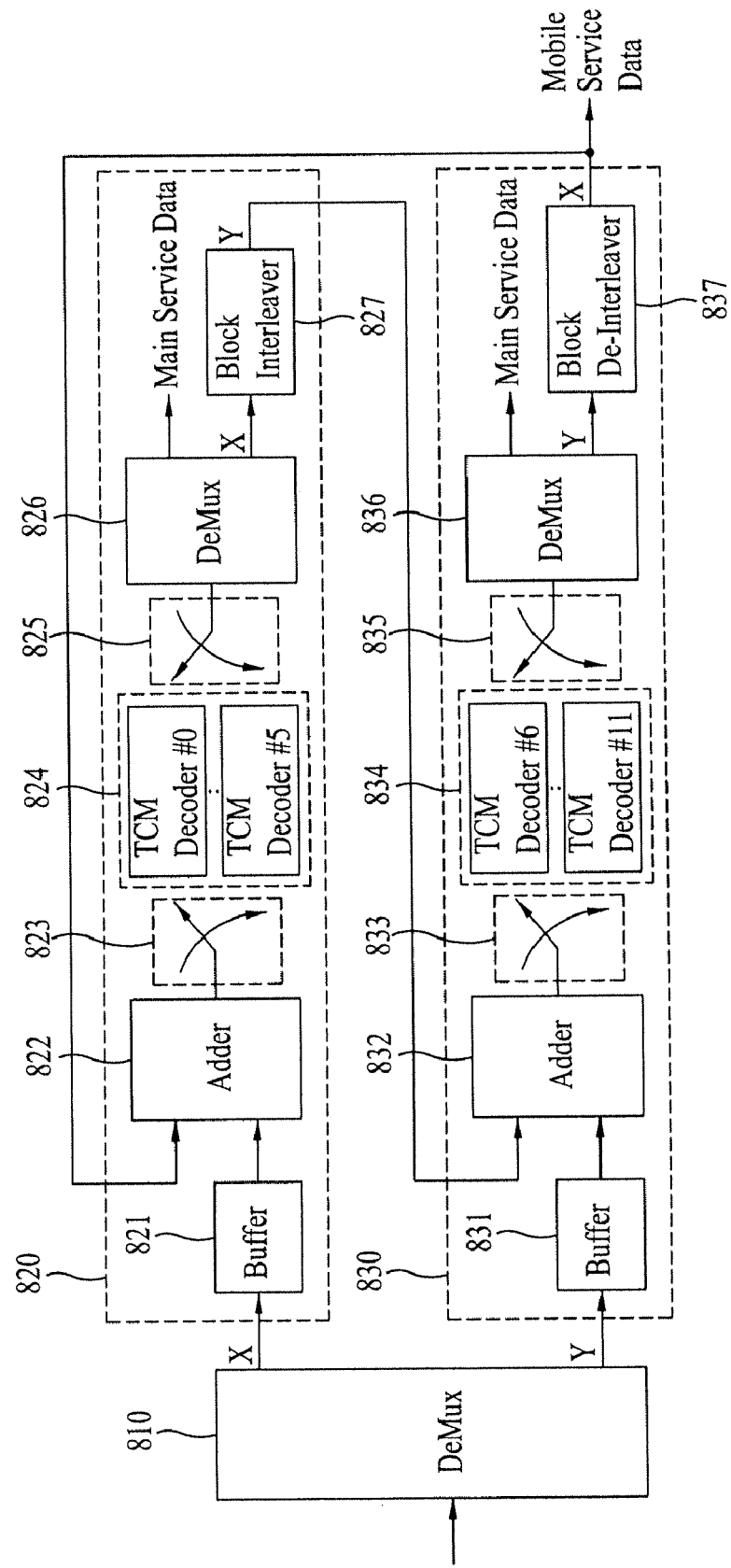
FIG. 13 illustrates a block diagram showing a structure of a block decoder of the receiving system according to an embodiment of the present invention.

FIG. 13 illustrates a block view showing the structure of the block decoder 705 according to an embodiment of the present invention. Herein, FIG. 13 illustrates an example of performing regressive turbo decoding on the mobile service data, which has been processed with additional encoding by the transmitter (or transmitting system), thereby additionally enhancing the performance of the present invention. The block decoder shown in FIG. 13 is a structure corresponding to the block processor and trellis encoding module shown in FIG. 7A, which is a concatenated structure between the trellis decoder and the block deinterleaver. The block decoder of FIG. 13 shows an example of decoding mobile service data that are first encoded at a ½-coding rate and then trellis encoded.

Referring to FIG. 13, the block decoder includes a demultiplexer 810, a first decoder 820, and a second decoder 830. The first decoder 820 may include a buffer 821, an adder 822, a switching unit 823, trellis decoders 824 numbered from 0 to 5 (or TCM decoders #0 to #5), a switching unit 825, a demultiplexer 826, and a block interleaver 827. The second decoder 830 may include a buffer 831, an adder 832, a switching unit 833, trellis decoders 834 numbered from 6 to 11 (or TCM decoders #6 to #11), a switching unit 835, a demultiplexer 836, and a block deinterleaver 837. Herein, the data outputted from the block interleaver 827 of the first decoder 820 are inputted to the adder 832 of the second decoder 830. And, the data outputted from the block deinterleaver 837 of the second decoder 830 are inputted to the adder 822 of the first decoder 820. In this embodiment of the present invention, the trellis decoders 824 of the first decoder 820 correspond to the first to sixth trellis decoders. And, the trellis decoders 834 of the second decoder 830 correspond to the seventh to twelfth trellis decoders.

More specifically, the data outputted from the equalizer 704 are inputted to the demultiplexer 810 of the block decoder 705. The demultiplexer 810 identifies the symbols corresponding to each branch (i.e., symbols corresponding to X and Y in FIG. 2) of the block processor included in the transmitting system (or transmitter). Thereafter, the demultiplexer 810 outputs the identified symbols to each respective buffer 821 and 831. Each of the buffers 821 and 831 stores the output data corresponding to one block. Then, while the turbo decoding process is in progress, each buffer 821 and 831 repeatedly outputs data to the respective adders 822 and 832 as many times as the number of cycles. The size of the block used herein is identical to the size of the block interleaver used in the block processor. More specifically, the size of the present block is identical to the interleaving size (i.e., K) of the actual symbol of the block interleaver used in FIG. 4. This is because the turbo decoding process is performed between the trellis decoder and the block deinterleaver.

Assuming that the block processor of FIG. 2 is designed to input symbol X to trellis encoders #0 to #5 and to input symbol Y to trellis encoders #6 to #11, the adder 821 outputs data to the trellis decoders (or TCM decoders) respective to the trellis encoders #0 to #5. At this point, the trellis decoding result of the mobile service data outputted from each trellis decoder corresponds to a log likelihood ratio (LLR), which is a logarithm calculated from the soft decision value. Herein, LLR indicates a log value corresponding to a ratio between a likelihood value (or probability value) of the input bit being equal to '1' and a likelihood value of the input bit being equal to '0'.

The output of the trellis decoder 824 is inputted to the demultiplexer 826 through the switching unit 825. The demultiplexer 826 receives the data outputted from the TCM decoders #0 to #5, thereby identifying the main service data and the mobile service data. Then, the demultiplexer 826 outputs the identified mobile service data to the block interleaver 827. The block interleaver 827 of the first decoder 820 has the same structure as the block interleaver used in the block processor of the transmitting system. The block interleaver 827 outputs the block interleaved LLR, as shown in FIG. 4, to the adder 832 of the second decoder 830. At this point, the data being inputted to the block interleaver 827 correspond to the LLR respective to the X data. When the LLR respective to the X data passes through the block interleaver 827, the corresponding LLR becomes the LLR respective to the Y data. In this case, it is assumed that the block interleaver of FIG. 2 has the same structure as the block interleaver of FIG. 13.

The adder 832 adds the Y data outputted from the buffer 831 and the LLR of the Y data, which is outputted from the block interleaver 827. Thereafter, the adder 832 outputs the added result to the trellis decoders 834 (or TCM decoders #6 to #11) through the switching unit 834. At this point, the data being outputted from the buffer 831 and the data being outputted from the block interleaver 827 are data corresponding to the same location within the respective block. For example, when the data being outputted from the block interleaver 827 correspond to the third symbol within the block, the adder 832 adds the third symbol of the block stored in the buffer 831 thereto, thereby inputting the added result to the corresponding trellis decoder. In order to do so, the buffer 831 stores the corresponding block data while the regressive turbo decoding process is in progress. Then, by using delays, the buffer 832 enables the soft decision value (e.g., LLR) of the output symbol outputted from the block interleaver 827 and the symbol of the buffer 831 corresponding to the same position within the block of the output symbol pass through the adder 832 and the switching unit 833, so as to be inputted to the corresponding trellis decoder 834. This process may be identically applied to the buffer 821, adder 822, and trellis decoder 824 of the first decoder 820.

The data trellis-decoded by the trellis decoder 834 are inputted to the demultiplexer 836 through the switching unit 835. In this case also, the trellis decoding result of the mobile service data outputted from each trellis decoder corresponds to a log likelihood ratio (LLR), which is a logarithm calculated from the soft decision value. The demultiplexer 836 receives the data outputted from the TCM decoders #6 to #11, thereby identifying the main service data and the mobile service data. Then, the demultiplexer 836 outputs the identified mobile service data to the block deinterleaver 837. Since the LLR exists only with respect to the mobile service data, the main service data being outputted from the adders 822 and 832 are trellis decoded by each respective trellis decoder and then directly outputted in the form of hard decision values, without being processed with any block interleaving or deinterleaving processes. Although only the main service data are mentioned in the description of the present invention, known data and RS parity data are also transmitted without being processed with additional encoding by the block processor. Therefore, the known data and RS parity data are also considered and processed identically as the main service data.

The block deinterleaver 837 block-deinterleaves the LLR of the mobile service data, as an inverse process of the block interleaver used in the block processor of FIG. 2. In this case, the data being inputted to the block deinterleaver 837 correspond to the LLR respective to the Y data. Herein, when the LLR respective to the Y data passes through the block deinterleaver 837, the corresponding LLR becomes the LLR respective to the X data. The LLR respective to the X data outputted from the block deinterleaver 837 is then inputted to the adder 822 of the first decoder 820, thereby being processed with regressive turbo decoding. At this point, the regressive turbo decoding process is repeated as long as the number of turbo decoding cycles remains.

If the number of turbo decoding cycles no longer remains, the output data of the block deinterleaver 837 are inputted to the data deformatter 706 of FIG. 12. More specifically, after the above-described process is performed during the predetermined number of repetition of the turbo decoding process, the data of the next block pass through the demultiplexer 810 and inputted to the buffers 821 and 831 of the first decoder 820 and the second decoder 830, respectively, thereby repeating the turbo decoding process. In other words, once the turbo decoding process is repeated for a predetermined number of times, the data outputted from the block deinterleaver 837 are inputted to the data deformatter 706. Thus, the block decoding process for one block is completed. In the description of the present invention, this process is referred to as the regressive turbo decoding process for simplicity.

Figure 14:
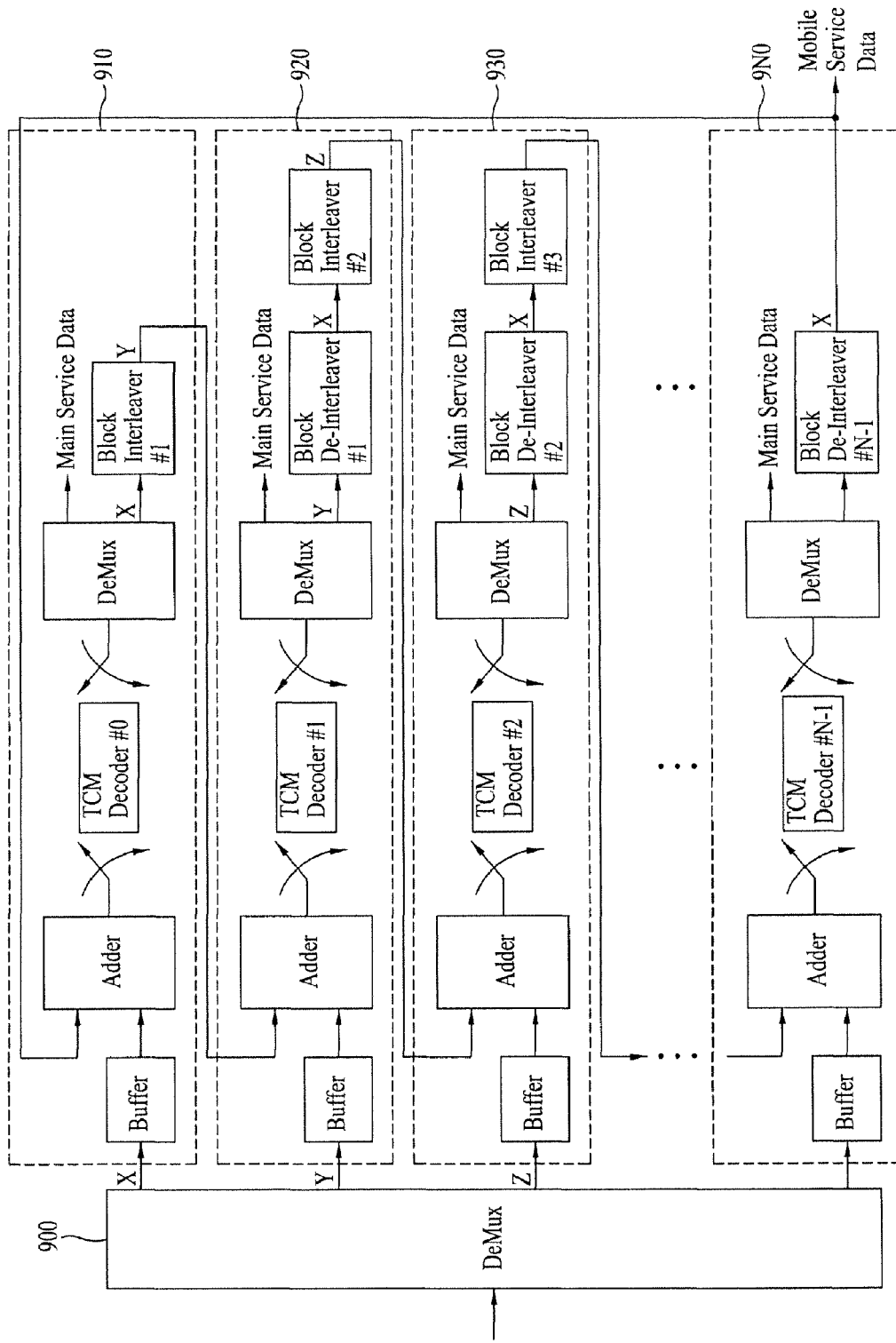
FIG. 14 illustrates a block diagram showing a structure of a block decoder of the receiving system according to another embodiment of the present invention.

FIG. 14 illustrates the block decoder of FIG. 12 according to another embodiment of the present invention. Herein, FIG. 14 illustrates an example of a block decoder decoding mobile service data, which have been encoded at a coding rate of 1/N. Accordingly, the block decoder includes a demultiplexer 900, and N number of decoders 910 to 9N0. In this embodiment of the present invention, when it is assumed that 12 trellis decoders are provided in the block decoder, the integer N may be equal to or less than 12 (i.e., N≦12). Referring to FIG. 14, the first decoder 910 may include a buffer, an adder, 12/N number of trellis decoders, and a block interleaver. The $N^{th}$ decoder 9N0 may include a buffer, an adder, 12/N number of trellis decoders, and a block deinterleaver. The decoders other than the first and $N^{th}$ decoders 910 and 9N0 may each include a buffer, an adder, 12/N number of trellis decoders, a block deinterleaver, and a block interleaver.

In this case also, the trellis decoding result of the mobile service data outputted from each trellis decoder corresponds to a log likelihood ratio (LLR), which is a logarithm calculated from the soft decision value. More specifically, the data outputted from the equalizer 704 are inputted to the demultiplexer 900 of the block decoder 705. The demultiplexer 900 identifies the symbols corresponding to each branch (i.e., symbols corresponding to X, Y, Z, . . . ) of the block processor included in the transmitting system (or transmitter). Thereafter, the demultiplexer 900 outputs the identified symbols to each buffer of the $1^{st}$ to $N^{th}$ decoder 910 to 9N0. This process is performed sequentially with respect to each branch. Subsequently, each buffer stores the output data corresponding to one block. Then, while the turbo decoding process is in progress, each buffer repeatedly outputs data to the respective adders as many times as the number of cycles. The size of the block used herein is identical to the size of the block interleaver used in the block processor having the coding rate of 1/N, as shown in FIG. 8. Furthermore, the block deinterleaver performs the inverse process of the corresponding block interleaver used in the block processor of FIG. 8.

For example, the block interleaver of the first decoder 910 is designed to receive the LLR corresponding to the X data and to output the LLR corresponding to the Y data. The block deinterleaver of the second decoder 920 is designed to receive the LLR corresponding to the Y data and to output the LLR corresponding to the X data. Then, the block interleaver formed at the output end of the block deinterleaver of the second decoder 920 is designed to receive the LLR corresponding to the X data and to output the LLR corresponding to the Z data. This process may be identically applied to the remaining decoders.

In this case, the data outputted from the block interleaver of the first decoder 910 are inputted to the adder of the second decoder 920. And, the data outputted from the block interleaver of the second decoder 920 are inputted to the adder of the third decoder 930. This process is performed identically up to the $(N-1)^{th}$ decoder. Thereafter, the data outputted from the block interleaver of the $N^{th}$ decoder 9N0 are inputted to the adder of the first decoder 910. This process is repeated as many times as the predetermined number of repletion cycles, thereby performing the regressive decoding process.

For example, when N is equal to 12 (i.e., N=12), trellis decoding is performed in the first decoder 910 with respect to the first branch of the block processor. Then, the corresponding LLR is converted to the LLR respective of the second branch of the block interleaver, which is then inputted to the adder of the second decoder 920. The adder of the second decoder 920 adds the data outputted from the buffer corresponding to the second branch to the data outputted from the block interleaver. Thereafter, the adder of the second decoder 920 outputs the added data to the corresponding trellis decoder. This process is repeated up to the $N^{th}$ decoder 9N0. Once the process for the last branch is completed, the result from the block deinterleaver of the $N^{th}$ decoder 9N0 is inputted to the adder of the first decoder 910. Subsequently, the symbol of the first branch is added to the inputted result, thereby performing the regressive decoding process.

If the number of turbo decoding cycles no longer remains, the data outputted from the block deinterleaver 837 of the $N^{th}$ decoder 9N0 are inputted to the data deformatter 706 of FIG. 12. More specifically, after the above-described process is performed during the predetermined number of repetition of the turbo decoding process, the data of the next block pass through the demultiplexer 900 and inputted to the buffers corresponding to each of the first to $N^{th}$ decoders 910 to 9N0, thereby repeating the turbo decoding process. At this point, the number of regressive turbo decoding processes of the block decoder 705 may be defined and decided while taking into consideration the hardware complexity and error correction performance of the present invention. In this case, if the number of decoding processes increases, the error correction performance may be enhanced. However, the hardware configuration may become more complex.

As described above, the digital broadcasting system and method of processing data according to the present invention have the following advantages. More specifically, the present invention is robust against (or resistant to) any error that may occur when transmitting mobile service data through a channel. And, the present invention is also highly compatible to the conventional system. Moreover, the present invention may also receive the mobile service data without any error even in channels having severe ghost effect and noise.

Additionally, by performing error correction encoding and error detection encoding processes on the mobile service data and transmitting the processed data, the present invention may provide robustness to the mobile service data, thereby enabling the data to effectively respond to the frequent change in channels. Particularly, since the present invention is designed so that the 12 trellis encoders can be configured in parallel concatenation, a separate external encoder is not required. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A broadcast transmitter for processing digital broadcast data, the broadcast transmitter comprising:
 a pre-processor for pre-processing mobile data, wherein the pre-processor comprises:
 a first randomizer for randomizing the mobile data;
 a first encoder for Reed-Solomon (RS) encoding and cyclic redundancy check (CRC) encoding the randomized mobile data;
 a symbol interleaver for interleaving symbols corresponding to the RS-CRC encoded mobile data according to the following equation:

$$P(i) = \{S \times i \times (i+1)/2\} \bmod L,$$

wherein $0 \leq i \leq L-1$, $L \geq K$, $L = 2^n$, n and S are integers, and K is a number of symbols being input to the symbol interleaver;
 a symbol-byte converter for converting the interleaved symbols into data bytes;
 a group formatting unit for forming a first data group including mobile data corresponding to the converted data bytes, known data sequences, place holders for non-systematic RS parity data and place holders for moving picture experts group (MPEG) header data;
 a data deinterleaver for deinterleaving data of the first data group; and
 a packet formatter for removing the place holders for non-systematic RS parity data and replacing the place holders for MPEG header data with MPEG header data in order to output a second data group;
 a second randomizer for randomizing MPEG header data of the second data group; and
 a data interleaver for interleaving data of the second data group having the randomized MPEG header data in order to output a third data group,
 wherein the second data group comprises rows having a length of 207 bytes, at least one of the rows in the second data group having N bytes of MPEG header data,
 wherein the third data group comprises rows having a length of 207 bytes, at least one of the rows in the third data group having M bytes of MPEG header data, and
 wherein N<M and M and N are integers greater than 1.

2. The broadcast transmitter of claim 1, wherein:
 the third data group has first, second and third regions;
 the second region is positioned between the first and third regions;
 an ith segment of the second region has X bytes of mobile data;
 an (i+1)th segment of the second region has Y bytes of mobile data;
 an (i+2)th segment of the second region has Z bytes of mobile data;
 a jth segment of the first region has Q bytes of mobile data; and
 X<Y<Z<Q, i>1 and j>1.

3. The broadcast transmitter of claim 1, wherein at least four of the known data sequences in the first data group are spaced 16 segments apart.

4. The broadcast transmitter of claim 1, further comprising:
 a second encoder for RS encoding the data of the second data group that has the randomized MPEG header data with a non-systematic RS encoding scheme.

5. A method for processing digital broadcast data in a broadcast transmitter, the method comprising:
 pre-processing, by a pre-processor, mobile data by:
 randomizing the mobile data;
 Reed-Solomon (RS) encoding and cyclic redundancy check (CRC) encoding the randomized mobile data;
 interleaving, by a symbol interleaver, symbols corresponding to the RS-CRC encoded mobile data according to the following equation:

$$P(i) = \{S \times i \times (i+1)/2\} \bmod L$$

wherein $0 \leq i \leq L-1$, $L \geq K$, $L = 2^n$, n and S are integers, and K is a number of symbols being inputted to the symbol interleaver;
 converting the interleaved symbols into data bytes;
 forming a first data group including mobile data corresponding to the converted data bytes, known data sequences, place holders for non-systematic RS parity data and place holders for moving picture experts group (MPEG) header data;

deinterleaving data of the first data group; and removing the place holders for non-systematic RS parity data and replacing the place holders for MPEG header data with MPEG header data in order to output a second data group;

randomizing, by a randomizer, MPEG header data of the second data group; and interleaving, by a data interleaver, data of the second data group having the randomized MPEG header data in order to output a third data group, wherein the second data group comprises rows having a length of 207 bytes, at least one of the rows in the second data group having N bytes of MPEG header data, wherein the third data group comprises rows having a length of 207 bytes, at least one of the rows in the third data group having M bytes of MPEG header data, and wherein N<M and M and N are integers greater than 1.

6. The method of claim 5, wherein the third data group has first, second and third regions, wherein:

the second region is positioned between the first and third regions;

an ith segment of the second region has X bytes of mobile data;

an (i+1)th segment of the second region has Y bytes of mobile data; and (i+2)th segment of the second region has Z bytes of mobile data;

a jth segment of the first region has Q bytes of mobile data; and

X<Y<Z<Q, i>1 and j>1.

7. The method of claim 5, wherein at least four of the known data sequences in the first data group are spaced 16 segments apart.

8. The method of claim 5, further comprising:

RS encoding the data of the second data group that has the randomized MPEG header data with a non-systematic RS encoding scheme.

* * * * *